United States Patent
Takahata et al.

(10) Patent No.: US 9,234,257 B2
(45) Date of Patent: Jan. 12, 2016

(54) PRODUCTION METHOD FOR HIGH-PURITY LANTHANUM, HIGH-PURITY LANTHANUM, SPUTTERING TARGET COMPOSED OF HIGH-PURITY LANTHANUM, AND METAL GATE FILM CONTAINING HIGH-PURITY LANTHANUM AS MAIN COMPONENT

(75) Inventors: Masahiro Takahata, Ibaraki (JP); Takeshi Gohara, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 246 days.

(21) Appl. No.: 13/883,126

(22) PCT Filed: Nov. 14, 2011

(86) PCT No.: PCT/JP2011/076162
§ 371 (c)(1),
(2), (4) Date: May 28, 2013

(87) PCT Pub. No.: WO2012/067061
PCT Pub. Date: May 24, 2012

(65) Prior Publication Data
US 2013/0241010 A1    Sep. 19, 2013

(30) Foreign Application Priority Data

Nov. 19, 2010  (JP) ................................. 2010-259008
Nov. 19, 2010  (JP) ................................. 2010-259418
Feb. 21, 2011  (JP) ................................. 2011-034613
Feb. 21, 2011  (JP) ................................. 2011-034614

(51) Int. Cl.
| | | |
|---|---|---|
| H01L 21/20 | (2006.01) | |
| H01L 21/36 | (2006.01) | |
| C22B 9/02 | (2006.01) | |
| C22B 5/04 | (2006.01) | |
| C22B 9/22 | (2006.01) | |
| C22B 59/00 | (2006.01) | |
| C22C 28/00 | (2006.01) | |
| C23C 14/16 | (2006.01) | |
| C23C 14/34 | (2006.01) | |
| C22B 9/05 | (2006.01) | |
| C23C 14/14 | (2006.01) | |
| H01L 29/51 | (2006.01) | |

(52) U.S. Cl.
CPC ... *C22B 9/02* (2013.01); *C22B 5/04* (2013.01); *C22B 9/05* (2013.01); *C22B 9/221* (2013.01); *C22B 59/00* (2013.01); *C22C 28/00* (2013.01); *C23C 14/14* (2013.01); *C23C 14/165* (2013.01); *C23C 14/3414* (2013.01); *H01L 29/517* (2013.01)

(58) Field of Classification Search
CPC ........ H01L 29/517; C22B 59/00; C22C 28/00
See application file for complete search history.

(56) References Cited

U.S. PATENT DOCUMENTS

| | | | |
|---|---|---|---|
| 8,668,785 B2 | 3/2014 | Shindo et al. | |
| 8,911,600 B2 | 12/2014 | Satoh et al. | |
| 8,980,169 B2 | 3/2015 | Takahata et al. | |
| 9,013,009 B2 | 4/2015 | Takahata et al. | |
| 2007/0003790 A1* | 1/2007 | Tsukatani et al. | ............ 428/702 |
| 2010/0260640 A1 | 10/2010 | Shindo et al. | |
| 2010/0272596 A1 | 10/2010 | Takahata et al. | |
| 2010/0323878 A1* | 12/2010 | Ishizawa | ........................ 501/151 |
| 2011/0114481 A1 | 5/2011 | Satoh et al. | |
| 2011/0290644 A1 | 12/2011 | Tsukamoto et al. | |
| 2011/0308940 A1 | 12/2011 | Tsukamoto et al. | |
| 2012/0045380 A1 | 2/2012 | Satoh et al. | |
| 2013/0129564 A1* | 5/2013 | Gschneidner et al. | ......... 420/580 |
| 2014/0199203 A1 | 7/2014 | Takahata et al. | |
| 2014/0301890 A1 | 10/2014 | Takahata | |

FOREIGN PATENT DOCUMENTS

| | | |
|---|---|---|
| JP | 63-011628 A | 1/1988 |
| JP | 04-046014 A | 2/1992 |
| JP | 04-214824 A | 5/1992 |
| JP | 05-017134 A | 1/1993 |
| JP | 10-287402 A | 10/1998 |
| JP | 2007-169683 A | 7/2007 |

OTHER PUBLICATIONS

E. Tokumitsu et al., "A Study on High-Dielectric-Constant Oxide Materials for MOSFET Gate Insulator Applications", Denshi-zairyo Kenkyu-kai Shiryo of Institute of Electrical Engineers of Japan, vol. 6-13, pp. 37-41, Sep. 21, 2000.

K. Shima, "Process of High-Purity Metals and Physical Property", CMC Publishing Co., Ltd., Trade Edition, 1st Printing, pp. 8 and 124-129, Dec. 2000.

* cited by examiner

*Primary Examiner* — Zandra Smith
*Assistant Examiner* — John M Parker
(74) *Attorney, Agent, or Firm* — Howson & Howson LLP

(57) ABSTRACT

A method for producing high-purity lanthanum having a purity of 4N or more excluding rare earth elements other than lanthanum and gas components, wherein lanthanum having a purity of 4N or more is produced by reducing, with distilled calcium, a lanthanum fluoride starting material that has a purity of 4N or more excluding rare earth elements other than lanthanum and gas components, and the obtained lanthanum is subjected to electron beam melting to remove volatile substances. The method for producing high-purity lanthanum, in which Al, Fe, and Cu are respectively contained in the amount of 10 wtppm or less. The method for producing high-purity lanthanum, in which total content of gas components is 1000 wtppm or less. The present invention aims to provide a technique capable of efficiently and stably providing high-purity lanthanum, a sputtering target composed of high-purity lanthanum, and a thin film for metal gate that contains high-purity lanthanum as a main component.

4 Claims, No Drawings

PRODUCTION METHOD FOR HIGH-PURITY LANTHANUM, HIGH-PURITY LANTHANUM, SPUTTERING TARGET COMPOSED OF HIGH-PURITY LANTHANUM, AND METAL GATE FILM CONTAINING HIGH-PURITY LANTHANUM AS MAIN COMPONENT

BACKGROUND

The present invention relates to a production method for high-purity lanthanum, high-purity lanthanum, a sputtering target composed of high-purity lanthanum, and a metal gate film containing high-purity lanthanum as main component.

Lanthanum (La) is one of rare earth elements that exists in the form of mixed complex oxides as mineral resources in earth's crust. Rare earth elements are so-called since they are separated from relatively rare minerals, however, their existence is not so rare in light of the overall earth's crust.

The atomic number of lanthanum is 57. It is a silvery white metal with atomic weight of 138.9 and has a double hexagonal close-packed structure at ambient temperature. It has the melting point of 921° C., boiling point of 3500° C., and density of 6.15 g/cm$^3$, and its surface is oxidized in air. It melts slowly in water, and is soluble in hot water as well as in acid. It is not ductile but exhibits slight malleability. Its specific resistance is $5.70 \times 10^{-6}$ Ωcm. It combusts at 445° C. or more to become an oxide ($La_2O_3$) (see Dictionary of Physics and Chemistry).

With rare earth elements, it is generally said that compounds with the oxidation number 3 are stable, and lanthanum is also trivalent. Recently, a lot of research and development have focused on lanthanum as electronic material such as metal gate material and high-dielectric constant material (High-k), making it one of the metals that is drawing a lot of attention.

Metallic lanthanum is a material of which purification is difficult to achieve since it is easily oxidized during the refining process, and a high-purity product thereof did not exist to date. In addition, metallic lanthanum turns black by oxidation in a short period of time when left exposed to air, creating additional problem for handling.

In recent years, thinning of a gate insulator film in the next-generation MOSFET is being demanded, but with the $SiO_2$ that has been conventionally used as the gate insulator film, the leak current increases due to the tunnel effect, and normal operation is becoming difficult.

For this reason, $HfO_2$, $ZrO_2$, $Al_2O_3$ and $La_2O_3$ having high dielectric constant, high thermal stability and high energy barrier against electron holes and electrons in silicon, have been proposed as its potential alternatives. Among these materials, $La_2O_3$ is considered to be especially promising. Its electrical characteristics have been studied, and its potential as gate insulator film in the next generation MOSFET has been reported (see Non-Patent Document 1). However, in this particular Non-Patent Document, the subject of the study is limited to $La_2O_3$ film, and the characteristics and behavior of lanthanum element are not explored.

On the other hand, a technology in which halogenated rare earth metals are reduced by calcium or hydrogenated calcium was proposed about 2 decades ago as a method for refining rare earth metals. This Document listed lanthanum as an example of rare earths, however, the technology was a rudimentary one involving slag separating jig as a means of separating slag, and did not disclose much about the problems associated with the use of metallic lanthanum element as well as the method for its refinement (see Patent Document 1).

As discussed above, the use of lanthanum (lanthanum oxide) is still in its early days and more research is required. In studying the properties of such lanthanum (lanthanum oxide), if lanthanum metal itself exists as a sputtering target material, it is possible to form a lanthanum thin film on a substrate and it will be easy to study the behavior at the interface with the silicon substrate and the properties of a high-dielectric gate insulator film or the like by forming a lanthanum compound. There is also a significant advantage in that the freedom of the target as a product will increase.

However, the problem of oxidation that can occur rapidly (within 10 minutes) when exposed to air would persist even if such a lanthanum sputtering target is produced. Once the oxidized film is formed on the target, it would result in the reduction of electric conductivity and lead to defects in sputtering. Moreover, if the target is left exposed to air for a long period of time, it would react with the moisture in the air and can become covered with white hydroxide powder, which in turn makes sputtering impossible.

For this reason, measures for preventing oxidation, such as vacuum-packing and covering with oil, need to be taken immediately after the production of target, however, these are extremely cumbersome processes. Due to these problems, the target material using lanthanum element still has not been realized.

Furthermore, generation of projections (nodules) on the surface of the target poses another problem when forming a film by sputtering with lanthanum target. These nodules elicit abnormal discharge, generating particles from the eruption of the nodules and the like.

Generation of particles causes an increase in the defect rate of metal gate films, semiconductor elements and devices. Especially problematic is the presence of carbon (graphite), which is a solid contained in lanthanum. Since graphite is conductive, it is difficult to detect. Thus improvement needs to be made to reduce its presence.

Moreover, although lanthanum is a material, of which purification is difficult to achieve, as discussed earlier, it is preferable to reduce the content of Al, Fe and Cu in addition to carbon (graphite) mentioned above, in order to take full advantage of the property of lanthanum. Furthermore, the presence of alkaline metals, alkali earth metals, transition metal elements, high-melting-point metal elements, and radioactive elements all adversely affect the property of semiconductor and therefore need to be reduced. From these considerations, the purity of lanthanum is preferably no less than 4N.

However, a problem exists in the difficulty of removing lanthanoids other than lanthanum. In general, minor contamination of lanthanoids other than lanthanum poses no major issues since their properties are similar enough to that of lanthanum. However, reducing the content of rare earth elements (including lanthanoids other than lanthanum) is still preferable.

Likewise, minor contamination of gas components also poses no major problems. Gas component is generally very difficult to be removed, and it is customary not to include the contribution from the gas component when indicating the purity.

Problems in the physical property of lanthanum, production method for highly purified lanthanum, behavior of impurities in lanthanum target, and the like have not been extensively explored to date. Therefore, it is highly desirable that these problems are adequately addressed as soon as possible.
Patent Document 1: Japanese Laid-Open Patent Publication No. S63-11628

Non-Patent Document 1: Written by Eisuke Tokumitsu and two others, "Study of oxide materials for High-k gate insulator film", The Institute of Electrical Engineers of Japan, Research Paper on Electronic Materials, Vol. 6-13, Page 37-41, issued on Sep. 21, 2001

SUMMARY OF INVENTION

Technical Problem

The present invention aims at providing a technique capable of stably providing a production method for high-purity lanthanum, a high-purity lanthanum, a sputtering target made from the high-purity lanthanum, a metal gate film formed using the sputtering target, and semiconductor elements and devices equipped with the metal gate film.

Solution to Problem

The present invention provides: (1) a method for producing high-purity lanthanum having a purity of 4N or more excluding rare earth elements other than lanthanum and gas components, wherein lanthanum having a purity of 4N or more is produced by reducing, with distilled calcium, a lanthanum fluoride starting material that has a purity of 4N or more excluding rare earth elements other than lanthanum and gas components, and the obtained lanthanum is subjected to electron beam melting to remove volatile substances.

The present invention further provides: (2) a method for producing high-purity lanthanum having a purity of 4N or more excluding gas components, wherein lanthanum having a purity of 4N or more is produced by reducing, with distilled calcium, a lanthanum fluoride starting material that has a purity of 4N or more excluding gas components, and the obtained lanthanum is subjected to electron beam melting to remove volatile substances.

The present invention further provides: (3) the method for producing high-purity lanthanum according to (1) or (2) above, wherein the high-purity lanthanum contains Al, Fe and Cu in the amount of 10 wtppm or less, respectively; and (4) the method for producing high-purity lanthanum according to (1) or (2) above, wherein the high-purity lanthanum contains Al and Fe in the amount of 5 wtppm or less, respectively, and Cu in the amount of 1 wtppm or less.

The present invention further provides: (5) the method for producing high-purity lanthanum according to (1) or (2) above, wherein the high-purity lanthanum has a purity of 4N5 or more; (6) the method for producing high-purity lanthanum according to one of (1) to (5) above, wherein the high-purity lanthanum contains C in the amount of 200 wtppm or less; (7) the method for producing high-purity lanthanum according to one of (1) to (6) above, wherein the total content of gas components is 1000 wtppm or less; and (8) the method for producing high-purity lanthanum according to one of (1) to (7) above, wherein the total content of rare earth elements other than lanthanum is 10 wtppm or less.

The present invention further provides: (9) a high-purity lanthanum, wherein the purity excluding rare earth elements other than lanthanum and gas components is 4N or more, and the content of Al, Fe, and Cu is respectively 10 wtppm or less.

The present invention further provides: (10) the high-purity lanthanum according to (9) above, wherein the purity excluding gas components is 4N5 or more, the content of Al and Fe is respectively 5 wtppm or less, and the content of Cu is 1 wtppm or less; (11) the high-purity lanthanum according to one of (9) to (10) above, wherein the content of C is 200 wtppm or less; (12) the high-purity lanthanum according to one of (9) to (11) above, wherein the total content of gas components is 1000 wtppm or less; and (13) the high-purity lanthanum according to one of (9) to (12) above, wherein the total content of rare earth elements other than lanthanum is 10 wtppm or less.

The present invention further provides: (14) a sputtering target produced using the high-purity lanthanum according to one of (9) to (13) above; (15) a metal gate film formed using the sputtering target according to (14) above; and (16) semiconductor elements and devices equipped with the metal gate film according to (15) above.

The present invention encompasses all of the novel substances described above as high-purity lanthanum. LaOx film is formed in the majority of cases where it is used as gate insulator film in MOSFET. In forming such a film, high-purity metallic lanthanum is required so that one can have more freedom in forming any types of film. The present invention can provide material that suits this purpose.

Rare earth elements belonging to lanthanum include Sc, Y, Ce, Pr, Nd, Pm, Sm, Eu, Gd, Tb, Dy, Ho, Er, Tm, Yb, and Lu in addition to La, and their similarity in physical properties make it difficult to separate them from La. Especially, Ce, being very similar to La, is extremely difficult to reduce.

In general, certain amounts of contaminating rare earth elements can be tolerated. However, in order to take full advantage of the properties of lanthanum element, the content of rare earth elements should be kept to no more than 100 wtppm, and more preferably to no more than 10 wtppm. The present invention enables one to satisfy these requirements.

The present invention mainly focuses on the issue of achieving a purity of 4N or more excluding rare earth elements other than lanthanum and gas components, and provides a solution to this issue. In addition, it also aims at obtaining a high-purity lanthanum having the respective contents of Aluminum (Al), Iron (Fe) and Copper (Cu) of 10 wtppm or less.

Generally, gas components include C, N, O, S and H. These can exist as individual elements or as compounds (such as $CO$, $CO_2$, and $SO_2$) or as compounds with constituent elements. Because these gas component elements have smaller atomic weight and atomic radius, they do not largely affect the properties of the material, as long as they, as contaminating impurities, are not contained in excessive amounts. Therefore, the purity is customarily indicated as the purity excluding the gas components. The purity of lanthanum in the present invention is also indicated as that excluding gas components.

However, that said, the presence of excessive amounts of gas components is still not preferable. Thus as described below, it is preferable to have gas components, such as oxygen, nitrogen, and hydrogen, at a total amount no more than 1000 wtppm.

The present invention is premised on producing high-purity lanthanum having a purity of 4N or more, or more preferably, 4N5 or more.

The present invention provides a sputtering target made from the high-purity lanthanum above, a metal gate film formed using the sputtering target, and semiconductor elements and devices equipped with the metal gate film.

As described above, when used as gate insulator film in MOSFET, mainly formed is a LaOx film. In forming such a film, high-purity metallic lanthanum is required so that one can have more freedom in forming any types of film.

The present invention can provide material that suites this requirement. Accordingly, the high-purity lanthanum of the present invention includes those produced in combination with other substances when preparing targets.

The high-purity lanthanum obtained as described above is subjected to electron beam (EB) melting in vacuum, and solidified into ingot. Electron beam melting significantly reduces gas components, and enables to lower the total amount of gas components, such as carbon, oxygen, nitrogen, sulfur, and hydrogen, to no more than 1000 wtppm. It should be further mentioned that during the removal of gas components by electron beam melting, residual Ca, which has persisted during the reduction by Ca and has remained at around several to several tens of ppm, reacts with the gas components and is removed simultaneously.

The ingot thus produced can be cut into appropriate sizes, and formed into sputtering target after grinding. Thus obtained is a high-purity lanthanum target having a purity of 4N or more (provided that gas components and rare earth elements other than lanthanum are excluded), wherein Al, Fe and Cu are respectively contained in the amount of 10 wtppm or less.

Moreover, by performing sputtering using the target, a metal gate film having the same composition can be obtained. The sputtering target, metal gate film, and semiconductor elements and devices using these, are all novel substances and included in the scope of the present invention.

The present invention achieves the excellent effect of stably providing a production method for high purity lanthanum, a high-purity lanthanum, a sputtering target made from the high-purity lanthanum, a metal gate film formed using the sputtering target, and semiconductor elements and devices equipped with the metal gate film.

DETAILED DESCRIPTION

In the present invention, a lanthanum fluoride starting material having a purity of 4N or more (provided that rare earth elements other than lanthanum, and gas components are excluded) can be used as the lanthanum starting material to be subjected to purification. This starting material contains Li, Na, K, Ca, Mg, Al, Si, Ti, Fe, Cr, Ni, Mn, Mo, Ce, Pr, Nd, Sm, Ta, W, and gas components (such as N, O, C and H) and the like as major impurities. Commercial lanthanum fluoride starting material has a purity of 4N or more and is considered to contain less of regular impurities. However, since it still contains a large quantity of gas components, it cannot be used directly as it is.

Aluminum (Al) and copper (Cu), contained in lanthanum as contaminants, are often used in alloy materials found in semiconductor parts such as substrate, source and drain; and if contained in the gate material, even at a small amount, these cause malfunction. In addition, iron (Fe) contained in lanthanum is readily oxidized and can cause defective sputtering when used in a target. Furthermore, even if it is not oxidized while being inside the target, it could become oxidized after being sputtered. When this occurs, the volume expansion would lead to defects such as insulation failure and ultimately to malfunction. For all of these reasons, reduction of these contaminants is required.

In addition, lanthanum fluoride, as a lanthanum starting material, is subjected to reduction by calcium. Since the reducing agent calcium contains impurities such as Fe, Al and Cu, one must be aware that these impurities from reducing agent could become a source of contamination. For this reason, distilled calcium, having the Cu content of less than 20 ppm, and more preferably of less than 2 ppm, is used for reduction.

Table 1 shows the comparison of the analysis on commercial Ca and two types of distilled Ca (one subjected to one distillation, and one subjected to two distillations). The commercial Ca shown in Table 1 has a high Cu content of 95 wtppm, suggesting that the use of this commercial Ca would increase the risk of Cu contamination.

TABLE 1

| Commercial Ca (wtppm) | | | | Ca distilled once (wtppm) | | | | Ca distilled twice (wtppm) | | | |
|---|---|---|---|---|---|---|---|---|---|---|---|
| Li | 0.35 | La | <0.05 | Li | 0.48 | La | <0.05 | Li | <0.05 | La | <0.05 |
| Be | <0.05 | Ce | <0.05 | Be | <0.05 | Ce | <0.05 | Be | <0.05 | Ce | <0.05 |
| B | <0.05 | Pr | <0.05 | B | 3.8 | Pr | <0.05 | B | <0.05 | Pr | <0.05 |
| F | <1 | Nd | <0.05 | F | <1 | Nd | <0.05 | F | <1 | Nd | <0.05 |
| Na | 0.33 | Sm | <0.05 | Na | 0.61 | Sm | <0.05 | Na | <0.2 | Sm | <0.05 |
| Mg | 5.2 | Eu | <0.05 | Mg | 3.6 | Eu | <0.05 | Mg | <0.05 | Eu | <0.05 |
| Al | 1.4 | Gd | <0.05 | Al | 4.2 | Gd | <0.05 | Al | <0.05 | Gd | <0.05 |
| Si | 1.5 | Tb | <0.05 | Si | 18 | Tb | <0.05 | Si | 2.7 | Tb | <0.05 |
| P | <0.05 | Dy | <0.05 | P | <0.05 | Dy | <0.05 | P | <0.05 | Dy | <0.05 |
| S | 0.11 | Ho | <0.05 | S | 0.76 | Ho | <0.05 | S | 0.24 | Ho | <0.05 |
| Cl | ~2100 | Er | <0.05 | Cl | ~680 | Er | <0.05 | Cl | 49 | Er | <0.05 |
| K | <0.5 | Tm | <0.05 | K | <0.5 | Tm | <0.05 | K | <0.5 | Tm | <0.05 |
| Ca | | Yb | <0.05 | Ca | | Yb | <0.05 | Ca | | Yb | <0.05 |
| Sc | <0.01 | Lu | <0.05 | Sc | <0.01 | Lu | <0.05 | Sc | <0.01 | Lu | <0.05 |
| Ti | 0.57 | Hf | <0.05 | Ti | 0.16 | Hf | <0.05 | Ti | <0.05 | Hf | <0.05 |
| V | 0.09 | Ta | <5 | V | <0.01 | Ta | <5 | V | <0.01 | Ta | |
| Cr | 0.16 | W | <0.1 | Cr | <0.05 | W | <0.1 | Cr | <0.05 | W | <0.1 |
| Mn | 26 | Re | <0.05 | Mn | 2.5 | Re | <0.05 | Mn | 0.16 | Re | <0.05 |
| Fe | <0.05 | Os | <0.05 | Fe | 3.5 | Os | <0.05 | Fe | 0.28 | Os | <0.05 |
| Co | <0.05 | Ir | <0.05 | Co | <0.05 | Ir | <0.05 | Co | <0.05 | Ir | <0.05 |
| Ni | <0.1 | Pt | <0.05 | Ni | <0.1 | Pt | <0.05 | Ni | <0.1 | Pt | <0.05 |
| Cu | 95 | Au | <1 | Cu | 12 | Au | <1 | Cu | <2 | Au | <1 |
| Zn | <0.1 | Hg | <0.1 | Zn | <0.1 | Hg | <0.1 | Zn | <0.1 | Hg | <0.1 |
| Ga | <0.05 | Tl | <0.05 | Ga | <0.05 | Tl | <0.05 | Ga | <0.05 | Tl | <0.05 |
| Ge | <0.5 | Pb | <0.05 | Ge | <0.5 | Pb | <0.05 | Ge | <0.5 | Pb | <0.05 |
| As | =<50 | Bi | <0.05 | As | =<50 | Bi | <0.05 | As | <0.5 | Bi | <0.05 |
| Se | =<10 | Th | <0.005 | Se | =<10 | Th | <0.005 | Se | <1 | Th | <0.005 |
| Br | <0.5 | U | <0.005 | Br | <0.5 | U | <0.005 | Br | <0.5 | U | <0.005 |
| Rb | <0.05 | C | 48 | Rb | <0.05 | C | 50 | Rb | <0.05 | C | 110 |
| Sr | =<1200 | N | 13 | Sr | =<2000 | N | 15 | Sr | =<230 | N | <10 |
| Y | <0.1 | O | 16 | Y | <0.1 | O | 30 | Y | <0.1 | O | 62 |
| Zr | <0.05 | S | <10 | Zr | <0.05 | S | <10 | Zr | <0.05 | S | <10 |
| Nb | <0.1 | H | 23 | Nb | <0.1 | H | 22 | Nb | <0.1 | H | 44 |

TABLE 1-continued

| Commercial Ca (wtppm) | | Ca distilled once (wtppm) | | Ca distilled twice (wtppm) | |
|---|---|---|---|---|---|
| Mo | <0.5 | Mo | <0.5 | Mo | <0.5 |
| Ru | <1 | Ru | <1 | Ru | <1 |
| Rh | <0.1 | Rh | <0.1 | Rh | <0.1 |
| Pd | <0.5 | Pd | <0.5 | Pd | <0.5 |
| Ag | <0.5 | Ag | <0.5 | Ag | <0.5 |
| Cd | <5 | Cd | <5 | Cd | <5 |
| In | <0.5 | In | <0.5 | In | |
| Sn | <0.5 | Sn | <0.5 | Sn | <0.5 |
| Sb | <0.1 | Sb | <0.1 | Sb | <0.1 |
| Te | <0.5 | Te | <0.5 | Te | <0.5 |
| I | <1 | I | <1 | I | <1 |
| Cs | <0.5 | Cs | <0.5 | Cs | <0.5 |
| Ba | 8.5 | Ba | 11.5 | Ba | 18 |

(Reduction with Calcium)

A tantalum (Ta) crucible is used as the melting crucible for reduction. Powdery $LaF_3$ and lump Ca are mixed and placed in this tantalum crucible. Usually, Ca, as a reducing material, is added at an amount about 10% in excess of the calculated amount. The content of the tantalum crucible placed within a reduction apparatus is then slowly heated to 600° C., and during which time, the inside of the reduction apparatus is evacuated to degas the content. Purified Argon gas is then injected to atmospheric pressure of 0.5.

The content is further heated and the reaction is initiated when the temperature of the content reaches 800° C. to 1000° C. The reaction formula is $2LaF_3+3Ca\rightarrow 2La+3CaF_2$. Since the reaction is exothermic reaction, it is completed rapidly. To improve the separation of purified metal and slag, the temperature is maintained at a temperature about 50° C. higher than the melting point of metallic La for several minutes.

The yield of metallic La is about 97%. Major impurities are unreacted reducing material and slag. Furthermore, because there is a possibility of contamination by Ta, which is a crucible material, as an impurity, the reducing reaction is preferably conducted at a lowest temperature possible. The metallic La is thus obtained.

(Electron Beam Melting)

The electron beam melting of the lanthanum compact is performed by extensive irradiation of a low output electron beam to the melting lanthanum material in a furnace. It is usually performed in the range of 9 kW to 32 kW. The electron beam melting can be repeated several times (two to four times). Repetition of the electron beam melting improves the removal of elements having high vapor pressure such as Ca, Mg, Mn, and Pb. In addition, gas components such as oxygen, nitrogen, and hydrogen can also be significantly removed, thus achieving the total content thereof of 1000 wtppm or less.

Furthermore, during the electron beam melting wherein the gas components are removed, the residual Ca, which persists after the reduction by Ca and remains at an amount of several to several tens of ppm, is also removed simultaneously by reacting with the gas components.

An increase in the output of the electron beam results in the residual oxygen reacting with C, and has an effect of improving the removal of carbon contaminating the lanthanum, as CO gas or $CO_2$ gas. However, excessive increase of the output may result in the contamination of Cu that constitutes the water-cooled parts of the furnace directly in contact with the La therein, therefore, the output should be kept within certain levels.

Rare earth elements need to be removed from the high-purity lanthanum as described above because it is technically very difficult to remove them during the production process of the high-purity lanthanum due to the similarity of chemical properties between lanthanum and other rare earth elements, and because it would not drastically alter the properties of the lanthanum even if there are some contaminations due to this similarity.

From these considerations, some contaminations of other rare earth elements are tolerated, up to a certain point. However, it goes without saying that it is preferable to keep the contamination to a minimum, in order to achieve improvement on the property of the lanthanum itself.

The present invention enables one to keep the total amount of rare earth elements other than lanthanum to 10 wtppm or less. This is one of the significant features of the present invention.

In addition, the reason for having a purity excluding gas components of 4N or more, and further of 4N5 or more, is because removal of gas components is difficult and if it is incorporated into purity considerations, the purity would no longer reflect improvements in actual purity. Moreover, compared with other contaminating elements, the inclusion of gas components, up to a certain level, is harmless in general.

Sputtering is employed in many cases where a thin film is formed for use in electronic materials such as gate insulator films and films for metal gate, and is considered to be a superior method for forming a thin film. Therefore, producing a high-purity lanthanum sputtering target using the lanthanum ingot described above is an effective approach.

Target can be produced following the conventional processes including forging, rolling, cutting, finishing (grinding) and the like. There are no particular limitations to the production process and any processes can be appropriately selected.

A high-purity lanthanum having a purity of 4N or more (provided that rare earth elements other than lanthanum, and gas components are excluded), and having Al, Fe and Cu each at an amount of 10 wtppm or less, can thus be obtained.

In addition, a high-purity lanthanum ingot having a purity of 4N5 or more (provided that gas components are excluded), and having C at an amount of 200 wtppm or less, Al and Fe each at 5 wtppm or less, and Cu at 1 wtppm or less, can thus be obtained. In regard to carbon (C) above, it is one of the gas components. By limiting the amount of C, as a gas component, to 200 wtppm or less, it is expected to improve the property of the lanthanum.

The high-purity lanthanum ingot described above is first cut into prescribed size and then is trimmed and grinded further to produce a target.

Using the high-purity target thus obtained, a high-purity lanthanum film can be formed on a substrate by sputtering. As a result, formed on a substrate are: a metal gate film having, as the main component, a high-purity lanthanum, which has a purity of 4N or more excluding rare earth elements other than lanthanum and gas components, and contains Al, Fe and Cu each at 10 wtppm or less; and a metal gate film having, as the main component, a high-purity lanthanum, which has a purity of 4N5 or more excluding gas components, and contains C at 200 wtppm or less, aluminum (Al) and iron (Fe) at 5 wtppm or less each, copper (Cu) at 1 wtppm or less, and overall rare earth elements excluding lanthanum at 10 wtppm or less. The film on the substrate reflects the composition of the target, thus, allowing one to form a high-purity lanthanum film.

The metal gate film may be used as one having the same composition as the high-purity lanthanum described above, or alternatively, it can also be used as one formed in combination with other gate materials, or as alloys or as compounds thereof. This can be accomplished by: simultaneous sputtering together with a target made from other gate materials; or sputtering using a mosaic target. The present invention encompasses all of these possibilities. The contents of impurities vary depending on the amounts of impurities contained in the raw materials, however, by using the production method described above, it becomes possible to limit the impurities within the ranges described above.

The present invention provides a technique capable of efficiently and stably providing a high-purity lanthanum, a sputtering target comprising the high-purity lanthanum, and a metal gate film having the high-purity lanthanum as the main component.

EXAMPLES

Next, Examples and Comparative Examples are explained. These Examples and Comparative Examples are provided only for the purpose of explaining the invention better and are not meant in any way to limit the present invention. In other words, other possible examples and modifications within the scope of the technological thought of the present invention are all considered to be included in the present invention.

Example 1

As the lanthanum starting material to be processed, lanthanum fluoride starting material having a purity of 4N was used. Metallic lanthanum is a material that is drawing a lot of attention lately, however, commercially available metallic lanthanum has a low purity and is unstable in terms of quality.

On the other hand, in regard to lanthanum fluoride, it is possible to obtain a commercialized product of high purity. However, lanthanum fluoride cannot be used as it is. Therefore, to efficiently and stably produce high-purity metallic lanthanum using the lanthanum fluoride starting material having a purity of 4N becomes essentially important.

Table 2 shows the result of the analysis on the lanthanum fluoride starting material. Major impurities contained therein include following elements. Na: 33 wtppm, Al: 3.5 wtppm, Si: 8.5 wtppm, S: 63 wtppm, Cl: 17 wtppm, Cu: 1.4 wtppm, Zn: 5.1 wtppm, C: 61 wtppm, N: 200 wtppm, O: 5600 wtppm, H: 1200 wtppm. As can be seen, gas components were included at high amounts.

Contaminating rare earth elements were included in relatively high amounts as follows. Ce: 63 wtppm, Pr: 14 wtppm, Nd: 9.2 wtppm, Sm: <0.1 wtppm, and so on.

TABLE 2

Commercial $LaF_3$ (High RE $LaF_3$) (wtppm)

| | | | |
|---|---|---|---|
| Li | <0.005 | La | |
| Be | <0.005 | Ce | 63 |
| B | 0.69 | Pr | 14 |
| F | | Nd | 9.2 |
| Na | 33 | Sm | <0.1 |
| Mg | 0.07 | Eu | <0.5 |
| Al | 3.5 | Gd | 3.5 |
| Si | 8.5 | Tb | 13 |
| P | 5.3 | Dy | <0.05 |
| S | 63 | Ho | <0.05 |
| Cl | 17 | Er | <0.05 |
| K | 7.8 | Tm | <0.05 |
| Ca | 17 | Yb | <0.05 |
| Sc | <0.05 | Lu | <0.05 |
| Ti | 0.09 | Hf | <0.05 |
| V | <0.005 | Ta | <5 |
| Cr | 0.62 | W | 0.56 |
| Mn | 0.07 | Re | <0.1 |
| Fe | 1.6 | Os | <0.05 |
| Co | 0.85 | Ir | <0.1 |
| Ni | 0.33 | Pt | <0.5 |
| Cu | 1.4 | Au | <0.5 |
| Zn | 5.1 | Hg | <0.1 |
| Ga | <0.1 | Tl | <0.1 |
| Ge | <0.5 | Pb | <0.5 |
| As | <5 | Bi | <0.1 |
| Se | <0.5 | Th | <0.005 |
| Br | <0.5 | U | <0.005 |
| Rb | <0.1 | C | 61 |
| Sr | <0.1 | N | 200 |
| Y | 1.2 | O | 5600 |
| Zr | 0.09 | S | 890 |
| Nb | 0.62 | H | 1200 |
| Mo | <0.05 | | |
| Ru | <0.05 | | |
| Rh | <0.5 | | |
| Pd | <0.5 | | |
| Ag | 0.38 | | |
| Cd | <0.5 | | |
| In | | | |
| Sn | <0.05 | | |
| Sb | <0.05 | | |
| Te | <0.05 | | |
| I | 3.8 | | |
| Cs | <0.01 | | |
| Ba | <1 | | |

(Reduction of the Starting Material by Calcium)

The melting crucible used for the reduction was made of tantalum (Ta) and had a dimension of φ250×H 400. 14.1 kg of powdery $LaF_3$ and 6 kg of lump Ca were mixed and placed inside this tantalum crucible. Ca used as the reducing material was distilled once and was analyzed as shown in Table 1. Ca was added at an amount about 10% in excess of the calculated amount.

The content of the tantalum crucible placed within a reduction apparatus was slowly heated to 600° C., and during which time, the inside of the reduction apparatus was evacuated to degas the content. Purified Argon gas was then injected to atmospheric pressure of 0.5.

The content was further heated. The reaction initiated when the temperature of the content reached 800° C. to 1000° C. The reaction formula is $2LaF_3+3Ca \rightarrow 2La+3CaF_2$. Since the reaction is exothermic reaction, it completed rapidly. To improve the separation of purified metal and slag, the temperature was maintained at a temperature about 50° C. higher than the melting point of metallic La. Since the melting temperature of La is 950° C., heating was adjusted so that the temperature was maintained at 50° C. higher than 950° C., that is 1000° C. Metallic La was thus obtained.

The result of the analysis of metallic La is shown in Table 3. As Table 3 shows, the following was observed. Al: 8.1 wtppm, Si: 4.4 wtppm, Ca: 3.9 wtppm, Fe: 8.3 wtppm, Cu: 4.3 wtppm, Mo: <0.05 wtppm, Ta: <5 wtppm, W: 0.12 wtppm, C: 100 wtppm, N: 93 wtppm, O: 1400 wtppm, S: <10 wtppm, H: 12 wtppm.

This was the result of reduction by Ca, however, the contents of Ca, as well as oxygen (O) were found to be high.

TABLE 3

| 4N (High RE) La (wtppm) | | | |
|---|---|---|---|
| Li | 0.01 | La | |
| Be | <0.01 | Ce | 53 |
| B | 0.63 | Pr | 16 |
| F | <5 | Nd | 9.4 |
| Na | 0.21 | Sm | <0.05 |
| Mg | 2.9 | Eu | <0.05 |
| Al | 8.1 | Gd | 0.96 |
| Si | 4.4 | Tb | 12 |
| P | 0.25 | Dy | 0.42 |
| S | 0.54 | Ho | 0.06 |
| Cl | <0.01 | Er | 0.06 |
| K | <0.01 | Tm | <0.05 |
| Ca | 3.9 | Yb | <0.05 |
| Sc | <0.005 | Lu | 1 |
| Ti | 0.8 | Hf | <0.05 |
| V | 0.22 | Ta | <5 |
| Cr | 0.4 | W | 0.12 |
| Mn | 0.19 | Re | <0.05 |
| Fe | 8.3 | Os | <0.05 |
| Co | 0.19 | Ir | <0.05 |
| Ni | 0.46 | Pt | <0.05 |
| Cu | 4.3 | Au | <0.5 |
| Zn | <0.05 | Hg | <0.1 |
| Ga | <0.05 | Tl | <0.05 |
| Ge | <0.1 | Pb | 0.74 |
| As | <0.05 | Bi | <0.01 |
| Se | <0.05 | Th | <0.001 |
| Br | <0.05 | U | <0.001 |
| Rb | <0.01 | C | 100 |
| Sr | <0.01 | N | 93 |
| Y | 8.1 | O | 1400 |
| Zr | 0.29 | S | <10 |
| Nb | <0.05 | H | 12 |
| Mo | <0.05 | | |
| Ru | <0.05 | | |
| Rh | <0.05 | | |
| Pd | <0.05 | | |
| Ag | <0.01 | | |
| Cd | <0.05 | | |
| In | <0.05 | | |
| Sn | <0.05 | | |
| Sb | <0.05 | | |
| Te | <0.05 | | |
| I | <0.05 | | |
| Cs | <0.1 | | |
| Ba | <1 | | |

(Electron Beam Melting)

Next, the lanthanum compact thus obtained was subjected to electron beam melting. This is performed by the extensive irradiation of a low output electron beam to the melting lanthanum material in a furnace. The irradiation was performed at the degree of vacuum of $6.0 \times 10^{-5}$ to $7.0 \times 10^{-4}$ mbar, and the melting output of 32 kW. The electron beam melting was repeated twice. The duration of melting was 30 minutes each. EB melt ingot was thus produced. It became possible to subject high volatile substance to volatilizing removal during the electron beam melting.

High-purity lanthanum was thus produced, The result of the analysis of the high-purity lanthanum after the electron beam melting is shown in Table 4. As Table 4 shows, the following was observed. Li: <0.005 wtppm, Na: <0.05 wtppm, Al: 2.4 wtppm, Si: 0.55 wtppm, Ca: 1.9 wtppm, Fe: 3.5 wtppm, Cu: 5.8 wtppm, Zn: <0.05 wtppm, Mo: <0.05 wtppm, Ta: <5 wtppm, W: 0.09 wtppm, C: 110 wtppm, N: 100 wtppm, O: 440 wtppm, S: <10 wtppm, and H: 10 wtppm. The analysis values all satisfied the requirements for the present invention.

The contents of oxygen and Ca, which were refractory to lowering during the reduction by Ca, were significantly lowered.

The purification step of this Example does not directly affect rare earth elements, therefore, in the cases where the contents of rare earth elements other than lanthanum exceed 100 wtppm, the lanthanum after the electron beam melting would still contain rare earth elements other than lanthanum exceeding 100 wtppm.

Depending on the uses, there are cases where the inclusion of rare earth elements other than lanthanum poses no problems. Thus, the present invention is understood to include all the conditions needed to produce the high-purity lanthanum having a purity of 4N or more excluding rare earth elements other than lanthanum, and gas components.

TABLE 4

| 4N (High RE) → EB (wtppm) | | | |
|---|---|---|---|
| Li | <0.005 | La | |
| Be | <0.01 | Ce | 66 |
| B | 0.85 | Pr | 17 |
| F | <5 | Nd | 9.1 |
| Na | <0.05 | Sm | <0.05 |
| Mg | 1.2 | Eu | 0.67 |
| Al | 2.4 | Gd | 1.2 |
| Si | 0.55 | Tb | 9.8 |
| P | 0.16 | Dy | 0.34 |
| S | 0.65 | Ho | <0.05 |
| Cl | <0.01 | Er | <0.05 |
| K | <0.01 | Tm | <0.05 |
| Ca | 1.9 | Yb | <0.05 |
| Sc | <0.005 | Lu | 0.87 |
| Ti | 0.67 | Hf | <0.05 |
| V | 0.17 | Ta | <5 |
| Cr | 0.23 | W | 0.09 |
| Mn | 0.08 | Re | <0.05 |
| Fe | 3.5 | Os | <0.05 |
| Co | 0.3 | Ir | <0.05 |
| Ni | 0.66 | Pt | <0.05 |
| Cu | 5.8 | Au | <0.5 |
| Zn | <0.05 | Hg | <0.1 |
| Ga | <0.05 | Tl | <0.05 |
| Ge | <0.1 | Pb | 0.22 |
| As | <0.05 | Bi | <0.01 |
| Se | <0.05 | Th | <0.001 |
| Br | <0.05 | U | <0.001 |
| Rb | <0.01 | C | 110 |
| Sr | <0.01 | N | 100 |
| Y | 5.3 | O | 440 |
| Zr | 0.21 | S | <10 |
| Nb | <0.05 | H | 10 |
| Mo | <0.05 | | |
| Ru | <0.05 | | |
| Rh | <0.05 | | |
| Pd | <0.05 | | |
| Ag | <0.01 | | |
| Cd | <0.05 | | |
| In | <0.05 | | |
| Sn | <0.05 | | |
| Sb | <0.05 | | |
| Te | <0.05 | | |
| I | <0.05 | | |
| Cs | <0.1 | | |
| Ba | <1 | | |

The lanthanum ingot thus obtained was subjected to a hot press if needed, followed by machine processing, and grinding to produce a discoid target having a dimension of ϕ140× 14t. The weight of the target was 1.42 kg. This was then joined with a backing plate to form a target for sputtering. The high-purity lanthanum target for sputtering having the composition described above was thus obtained. Since the target is highly prone to oxidization, it is preferable to be vacuum-packed for its storage or transportation.

Comparative Example 1

As the lanthanum starting material to be processed, a commercially available product having a purity of 2N5 to 3N level as shown in Table 5 shown below was used. The commercial lanthanum used in Comparative Example 1 was in tabular form with a dimension of 120 mm square×30 mm thick. The weight of one tablet was 2.0 kg to 3.3 kg. Total of 12 such tablets, equivalent to 24 kg of the starting material was used. These tabular lanthanum starting materials were vacuum-packed in aluminum since they were highly prone to oxidization.

As shown in Table 5, major impurities included the following. Li: 1200 wtppm, Na: 4.3 wtppm, Mg: 33 wtppm, Al: 120 wtppm, Si: 160 wtppm, S: 50 wtppm, Ti: 5.7 wtppm, Cr: 21 wtppm, Mn: 36 wtppm, Fe: 330 wtppm, Cu: 17 wtppm, Zr: 0.31 wtppm, C: 920 wtppm, N: <10 wtppm, O: 540 wtppm, S: <10 wtppm, and H: 26 wtppm.

TABLE 5

| Commercial La (wtppm) | | | |
|---|---|---|---|
| Li | 1200 | La | |
| Be | 0.02 | Ce | 700 |
| B | 2.1 | Pr | 37 |
| F | <5 | Nd | 170 |
| Na | 4.3 | Sm | 220 |
| Mg | 33 | Eu | <0.05 |
| Al | 120 | Gd | 3 |
| Si | 160 | Tb | 0.15 |
| P | 6.4 | Dy | 9.6 |
| S | 50 | Ho | 0.07 |
| Cl | 1.8 | Er | 0.16 |
| K | <0.01 | Tm | <0.05 |
| Ca | 0.99 | Yb | <0.05 |
| Sc | 0.01 | Lu | <0.05 |
| Ti | 5.7 | Hf | <0.05 |
| V | 0.28 | Ta | 15 |
| Cr | 21 | W | 4.8 |
| Mn | 36 | Re | <0.05 |
| Fe | 330 | Os | <0.05 |
| Co | 0.32 | Ir | <0.05 |
| Ni | 5.1 | Pt | <0.05 |
| Cu | 17 | Au | <0.5 |
| Zn | <0.05 | Hg | <1 |
| Ga | <0.05 | Tl | <0.05 |
| Ge | <0.1 | Pb | 0.54 |
| As | <0.05 | Bi | <0.01 |
| Se | <0.05 | Th | 0.05 |
| Br | <0.05 | U | 0.04 |
| Rb | <0.01 | C | 920 |
| Sr | 0.02 | N | <10 |
| Y | 1.6 | O | 540 |
| Zr | 0.31 | S | <10 |
| Nb | <0.05 | H | 26 |
| Mo | 20 | | |
| Ru | <0.05 | | |
| Rh | <0.05 | | |
| Pd | <0.05 | | |
| Ag | <0.01 | | |
| Cd | <0.05 | | |
| In | <0.05 | | |
| Sn | <0.05 | | |
| Sb | <0.05 | | |
| Te | <0.05 | | |
| I | <0.05 | | |
| Cs | <0.1 | | |
| Ba | <1 | | |

Next, the starting material was melted in an EB melting furnace at a degree of vacuum of $7.0 \times 10^{-5}$ to $3.5 \times 10^{-5}$ mbar, and melting output of 32 kW, and an ingot was produced at a molding speed of 45 kg/h. It became possible to subject high volatile substance to volatilizing removal during the electron beam melting.

High-purity lanthanum ingot of 22.54 kg was thus produced. The results of the analysis of the high-purity lanthanum thus obtained are shown in Table 6.

As shown in Table 6, major impurities in the lanthanum after the electron beam melting included the following. Li: 12 wtppm, Na: 0.86 wtppm, Mg: 2.7 wtppm, Al: 72 wtppm, Si: 29 wtppm, S: 30 wtppm, Ti: 1.9 wtppm, Cr: 4.2 wtppm, Mn: 6.4 wtppm, Fe: 130 wtppm, Cu: 9.2 wtppm, Zr: 0.22 wtppm, C: 1100 wtppm, N: <10 wtppm, O: 680 wtppm, S: 13 wtppm, and H: 23 wtppm.

As can be seen above, the contents of Al and Fe were not lowered, and the reduction of gas components also was not sufficient. Compared with the Examples, the amounts of impurities were high as a whole, and the goal of the present invention was not achieved.

TABLE 6

| Commercial La → EB (wtppm) | | | |
|---|---|---|---|
| Li | 12 | La | |
| Be | <0.01 | Ce | 410 |
| B | 0.9 | Pr | 25 |
| F | <5 | Nd | 65 |
| Na | 0.86 | Sm | 36 |
| Mg | 2.7 | Eu | <0.05 |
| Al | 72 | Gd | 1.5 |
| Si | 29 | Tb | 0.09 |
| P | 2.6 | Dy | 1 |
| S | 30 | Ho | 0.08 |
| Cl | 0.31 | Er | 0.18 |
| K | <0.01 | Tm | <0.05 |
| Ca | <0.05 | Yb | 2 |
| Sc | <0.005 | Lu | 0.14 |
| Ti | 1.9 | Hf | <0.05 |
| V | 0.29 | Ta | 20 |
| Cr | 4.2 | W | 8.1 |
| Mn | 6.4 | Re | <0.05 |
| Fe | 130 | Os | <0.05 |
| Co | 0.02 | Ir | <0.05 |
| Ni | 6.3 | Pt | <0.05 |
| Cu | 9.2 | Au | <0.5 |
| Zn | 0.09 | Hg | <0.1 |
| Ga | <0.05 | Tl | <0.05 |
| Ge | <0.1 | Pb | 0.24 |
| As | 0.82 | Bi | <0.01 |
| Se | <0.05 | Th | 0.011 |
| Br | <0.05 | U | 0.008 |
| Rb | <0.01 | C | 1100 |
| Sr | <0.01 | N | <10 |
| Y | 2.2 | O | 680 |
| Zr | 0.22 | S | 13 |
| Nb | <0.05 | H | 23 |
| Mo | 16 | | |
| Ru | <0.05 | | |
| Rh | <0.05 | | |
| Pd | <0.05 | | |
| Ag | <0.01 | | |
| Cd | <0.05 | | |
| In | <0.05 | | |
| Sn | <0.05 | | |
| Sb | <0.05 | | |
| Te | <0.05 | | |
| I | <0.05 | | |
| Cs | <0.1 | | |
| Ba | <1 | | |

Example 2

As the lanthanum starting material to be processed, lanthanum fluoride starting material having a purity of 4N was used.

Metallic lanthanum is a material that is drawing a lot of attention lately, however, commercially available metallic lanthanum has a low purity and is unstable in terms of quality.

On the other hand, in regard to lanthanum fluoride, it is possible to obtain a commercialized product of high purity. However, lanthanum fluoride cannot be used as it is. Therefore, to efficiently and stably produce high-purity metallic lanthanum using the lanthanum fluoride starting material having a purity of 4N becomes essentially important.

Table 7 shows the result of the analysis on the lanthanum fluoride starting material. Major impurities contained therein include following elements. Na: 33 wtppm, Al: 3.5 wtppm, Si: 8.5 wtppm, S: 63 wtppm, Cl: 17 wtppm, Cu: 1.4 wtppm, Zn: 5.1 wtppm, C: 61 wtppm, N: 200 wtppm, O: 5600 wtppm, H: 1200 wtppm. Gas components are included at high amounts.

Contaminating rare earth elements were included in relatively high amounts as follows. Ce: 63 wtppm, Pr: 14 wtppm, Nd: 9.2 wtppm, Sm: <0.1 wtppm, and so on.

TABLE 7

Commercial $LaF_3$ (High RE $LaF_3$) (wtppm)

| | | | |
|---|---|---|---|
| Li | <0.005 | La | |
| Be | <0.005 | Ce | 63 |
| B | 0.69 | Pr | 14 |
| F | | Nd | 9.2 |
| Na | 33 | Sm | <0.1 |
| Mg | 0.07 | Eu | <0.5 |
| Al | 3.5 | Gd | 3.5 |
| Si | 8.5 | Tb | 13 |
| P | 5.3 | Dy | <0.05 |
| S | 63 | Ho | <0.05 |
| Cl | 17 | Er | <0.05 |
| K | 7.8 | Tm | <0.05 |
| Ca | 17 | Yb | <0.05 |
| Sc | <0.05 | Lu | <0.05 |
| Ti | 0.09 | Hf | <0.05 |
| V | <0.005 | Ta | <5 |
| Cr | 0.62 | W | 0.56 |
| Mn | 0.07 | Re | <0.1 |
| Fe | 1.6 | Os | <0.05 |
| Co | 0.85 | Ir | <0.1 |
| Ni | 0.33 | Pt | <0.5 |
| Cu | 1.4 | Au | <0.5 |
| Zn | 5.1 | Hg | <0.1 |
| Ga | <0.1 | Tl | <0.1 |
| Ge | <0.5 | Pb | <0.5 |
| As | <5 | Bi | <0.1 |
| Se | <0.5 | Th | <0.005 |
| Br | <0.5 | U | <0.005 |
| Rb | <0.1 | C | 61 |
| Sr | <0.1 | N | 200 |
| Y | 1.2 | O | 5600 |
| Zr | 0.09 | S | 890 |
| Nb | 0.62 | H | 1200 |
| Mo | <0.05 | | |
| Ru | <0.05 | | |
| Rh | <0.5 | | |
| Pd | <0.5 | | |
| Ag | 0.38 | | |
| Cd | <0.5 | | |
| In | | | |
| Sn | <0.05 | | |
| Sb | <0.05 | | |
| Te | <0.05 | | |
| I | 3.8 | | |
| Cs | <0.1 | | |
| Ba | <1 | | |

(Reduction of the Starting Material by Calcium)

The melting crucible used for the reduction was made of tantalum (Ta) and had a dimension of φ250×H 400. 14.1 kg of powdery $LaF_3$ and 6 kg of lump Ca were mixed and placed inside this tantalum crucible. Ca used as the reducing material was distilled twice and was analyzed as shown in Table 1. Ca was added at an amount about 10% in excess of the calculated amount.

The content of the tantalum crucible placed within a reduction apparatus was slowly heated to 600° C., and during which time, the inside of the reduction apparatus was evacuated to degas the content. Purified Argon gas was then injected to atmospheric pressure of 0.5.

The content was further heated. The reaction initiated when the temperature of the content reached 800° C. to 1000° C. The reaction formula is $2LaF_3+3Ca \rightarrow 2La+3CaF_2$. Since the reaction is exothermic reaction, it completed rapidly. To improve the separation of purified metal and slag, the temperature was maintained at a temperature about 50° C. higher than the melting point of metallic La. Since the melting temperature of La is 950° C., heating was adjusted so that the temperature was maintained at 50° C. higher than 950° C., that is 1000° C.

Metallic La was thus obtained. The results of the analysis of the metallic La after the reduction by Ca are shown in Table 8.

TABLE 8

4N5 (High RE) La (wtppm)

| | | | |
|---|---|---|---|
| Li | <0.005 | La | |
| Be | <0.01 | Ce | 23 |
| B | 0.75 | Pr | 6 |
| F | <5 | Nd | 6.4 |
| Na | <0.05 | Sm | <0.05 |
| Mg | 1.8 | Eu | <0.05 |
| Al | 1.9 | Gd | 0.96 |
| Si | 0.55 | Tb | 12 |
| P | 0.06 | Dy | 0.42 |
| S | 0.1 | Ho | 0.06 |
| Cl | 0.06 | Er | 0.06 |
| K | <0.01 | Tm | <0.05 |
| Ca | 5.2 | Yb | <0.05 |
| Sc | <0.005 | Lu | 1 |
| Ti | 2.6 | Hf | <0.05 |
| V | <0.005 | Ta | <5 |
| Cr | 0.17 | W | 0.09 |
| Mn | <0.01 | Re | 0.36 |
| Fe | 0.69 | Os | <0.05 |
| Co | <0.01 | Ir | <0.05 |
| Ni | 0.28 | Pt | <0.05 |
| Cu | <0.05 | Au | <0.5 |
| Zn | <0.05 | Hg | <0.1 |
| Ga | <0.05 | Tl | <0.05 |
| Ge | <0.1 | Pb | 0.06 |
| As | <0.05 | Bi | <0.01 |
| Se | <0.05 | Th | 0.002 |
| Br | <0.05 | U | <0.001 |
| Rb | <0.01 | C | 120 |
| Sr | <0.01 | N | 90 |
| Y | 8.1 | O | 290 |
| Zr | 0.02 | S | <10 |
| Nb | 1.1 | H | 5.9 |
| Mo | <0.05 | | |
| Ru | <0.05 | | |
| Rh | <0.05 | | |
| Pd | <0.05 | | |
| Ag | <0.01 | | |
| Cd | <0.05 | | |
| In | <0.05 | | |
| Sn | <0.05 | | |
| Sb | <0.05 | | |
| Te | <0.05 | | |
| I | <0.05 | | |
| Cs | <0.1 | | |
| Ba | <1 | | |

As Table 8 shows, the following was observed. Al: 1.9 wtppm, Si: 0.55 wtppm, Ca: 5.2 wtppm, Fe: 0.69 wtppm, Cu:

<0.05 wtppm, Mo: <0.05 wtppm, Ta: <5 wtppm, W: 0.09 wtppm, C: 120 wtppm, N: 90 wtppm, O: 290 wtppm, S: <10 wtppm, H, 5.9 wtppm. This was the result of reduction by Ca, however, the content of Ca was found to be high.

(Electron Beam Melting)

Next, the lanthanum compact thus obtained was subjected to electron beam melting. This is performed by the extensive irradiation of a low output electron beam to the melting lanthanum material in a furnace. The irradiation was performed at the degree of vacuum of $6.0 \times 10^{-5}$ to $7.0 \times 10^{-4}$ mbar, and the melting output of 32 kW. The electron beam melting was repeated twice. The duration of melting was 30 minutes each. EB melt ingot was thus produced. It became possible to subject high volatile substance to volatilizing removal during the electron beam melting.

High-purity lanthanum was thus produced. The results of the analysis of the high-purity lanthanum after the electron beam melting are shown in Table 9. As Table 9 shows, the following was observed. Li: <0.005 wtppm, Na: <0.05 wtppm, Al: 1.5 wtppm, Si: 0.42 wtppm, S: 4.9 wtppm, Ca: 0.16 wtppm, Fe: 0.65 wtppm, Cu: <0.05 wtppm, Zn: <0.05 wtppm, Mo: <0.05 wtppm, <5 wtppm, W: <0.05 wtppm, C: 140 wtppm, N: 50 wtppm, O: 150 wtppm, S: <10 wtppm, and H: 22 wtppm. By using the Ca that was distilled twice, the purity was further improved and the analysis values satisfied all the requirements for the present invention. The contents of oxygen and Ca, which were refractory to lowering during the reduction by Ca, were significantly lowered.

TABLE 9

| 4N5 (High RE) → EB (wtppm) | | | |
|---|---|---|---|
| Li | <0.005 | La | |
| Be | <0.01 | Ce | 33 |
| B | 0.37 | Pr | 7.5 |
| F | <5 | Nd | 7.1 |
| Na | <0.05 | Sm | <0.05 |
| Mg | <0.05 | Eu | 0.67 |
| Al | 1.5 | Gd | 1.2 |
| Si | 0.42 | Tb | 9.8 |
| P | 0.08 | Dy | 0.34 |
| S | 4.9 | Ho | <0.05 |
| Cl | 0.19 | Er | <0.05 |
| K | <0.01 | Tm | <0.05 |
| Ca | 0.16 | Yb | <0.05 |
| Sc | <0.005 | Lu | 0.87 |
| Ti | 1.3 | Hf | <0.05 |
| V | <0.005 | Ta | <5 |
| Cr | <0.05 | W | <0.05 |
| Mn | <0.01 | Re | <0.05 |
| Fe | 0.65 | Os | <0.05 |
| Co | 0.03 | Ir | <0.05 |
| Ni | 0.05 | Pt | <0.05 |
| Cu | <0.05 | Au | <0.5 |
| Zn | <0.05 | Hg | <0.1 |
| Ga | <0.05 | Tl | <0.05 |
| Ge | <0.1 | Pb | 0.05 |
| As | <0.05 | Bi | <0.01 |
| Se | <0.05 | Th | <0.001 |
| Br | <0.05 | U | <0.001 |
| Rb | <0.01 | C | 140 |
| Sr | <0.01 | N | 50 |
| Y | 5.3 | O | 150 |
| Zr | 0.02 | S | <10 |
| Nb | 0.89 | H | 22 |
| Mo | <0.05 | | |
| Ru | <0.05 | | |
| Rh | <0.05 | | |
| Pd | <0.05 | | |
| Ag | <0.01 | | |
| Cd | <0.05 | | |
| In | <0.05 | | |
| Sn | <0.05 | | |
| Sb | <0.05 | | |

TABLE 9-continued

| 4N5 (High RE) → EB (wtppm) | |
|---|---|
| Te | <0.05 |
| I | <0.05 |
| Cs | <0.1 |
| Ba | <1 |

The lanthanum ingot thus obtained was subjected to a hot press if needed, followed by machine processing, and grinding to produce a discoid target having a dimension of φ140× 14t. The weight of the target was 1.42 kg. This was then joined with a backing plate to form a target for sputtering. The high-purity lanthanum target for sputtering having the composition described above was thus obtained. Since the target is highly prone to oxidization, it is preferable to be vacuum-packed for its storage or transportation.

Example 3

As the lanthanum starting material to be processed, lanthanum fluoride starting material having a purity of 4N (provided that the rare earth elements are included) was used. Metallic lanthanum is a material that is drawing a lot of attention lately, however, commercially available metallic lanthanum has a low purity and is unstable in terms of quality.

On the other hand, in regard to lanthanum fluoride, it is possible to obtain a commercialized product of high purity. However, lanthanum fluoride cannot be used as it is. Therefore, to efficiently and stably produce high-purity metallic lanthanum using the lanthanum fluoride starting material having a purity of 4N becomes essentially important.

Table 10 shows the result of the analysis on the lanthanum fluoride starting material. Major impurities contained therein include following elements. Na: 0.2 wtppm, Al: <0.05 wtppm, Si: 0.94 wtppm, Cl: 12 wtppm, Cu: <0.05 wtppm, Zn: <0.1 wtppm, C: 180 wtppm, N: 70 wtppm, O: 5200 wtppm, H: 540 wtppm. As can be seen, gas components were included at high amounts.

Contaminating rare earth elements were included only in low amounts as follows. Ce: 1.1 wtppm, Pr: <0.1 wtppm, Nd: 0.24 wtppm, Sm: 0.17 wtppm, and so on. Use of starting material with low amounts of rare earth elements enables the purity including rare earth elements (provided that lanthanum is excluded) to be 4N.

TABLE 10

| Low RE LaF$_3$ (wtppm) | | | |
|---|---|---|---|
| Li | 0.09 | La | |
| Be | <0.01 | Ce | 1.1 |
| B | 0.94 | Pr | <0.1 |
| F | | Nd | 0.24 |
| Na | 0.2 | Sm | 0.17 |
| Mg | 0.94 | Eu | <0.5 |
| Al | <0.05 | Gd | <0.5 |
| Si | 0.94 | Tb | <0.5 |
| P | 2.1 | Dy | <0.05 |
| S | 13 | Ho | <0.05 |
| Cl | 12 | Er | <0.05 |
| K | <0.5 | Tm | <0.05 |
| Ca | <0.1 | Yb | <0.05 |
| Sc | <0.05 | Lu | <0.05 |
| Ti | 0.09 | Hf | <0.05 |
| V | 0.26 | Ta | <5 |
| Cr | 0.17 | W | <0.05 |
| Mn | <0.01 | Re | <0.1 |
| Fe | 0.14 | Os | <0.05 |
| Co | <0.01 | Ir | <0.1 |

TABLE 10-continued

Low RE LaF$_3$ (wtppm)

| | | | |
|---|---|---|---|
| Ni | <0.01 | Pt | <0.5 |
| Cu | <0.05 | Au | <1 |
| Zn | <0.1 | Hg | <0.5 |
| Ga | <0.1 | Tl | <0.1 |
| Ge | <0.5 | Pb | <1 |
| As | <0.5 | Bi | <0.1 |
| Se | <5 | Th | <0.005 |
| Br | <5 | U | <0.005 |
| Rb | <5 | C | 180 |
| Sr | <0.05 | N | 70 |
| Y | <0.05 | O | 5200 |
| Zr | <0.05 | S | <10 |
| Nb | <0.05 | H | 540 |
| Mo | <0.05 | | |
| Ru | <0.1 | | |
| Rh | <0.1 | | |
| Pd | <0.5 | | |
| Ag | <0.5 | | |
| Cd | <1 | | |
| In | <0.5 | | |
| Sn | <0.5 | | |
| Sb | <0.5 | | |
| Te | <5 | | |
| I | <1 | | |
| Cs | <5 | | |
| Ba | <1 | | |

(Reduction of the Starting Material by Calcium)

The melting crucible used for the reduction was made of tantalum (Ta) and had a dimension of φ250×H 400. 14.1 kg of powdery LaF$_3$ and 6 kg of lump Ca were mixed and placed inside this tantalum crucible. Ca used as the reducing material was distilled once and was analyzed as shown in Table 1. Ca was added at an amount about 10% in excess of the calculated amount.

The content of the tantalum crucible placed within a reduction apparatus was slowly heated to 600° C., and during which time, the inside of the reduction apparatus was evacuated to degas the content. Purified Argon gas was then injected to atmospheric pressure of 0.5.

The content was further heated. The reaction initiated when the temperature of the content reached 800° C. to 1000° C. The reaction formula is $2LaF_3+3Ca \rightarrow 2La+3CaF_2$. Since the reaction is exothermic reaction, it completed rapidly. To improve the separation of purified metal and slag, the temperature was maintained at a temperature about 50° C. higher than the melting point of metallic La. Since the melting temperature of La is 950° C., heating was adjusted so that the temperature was maintained at 50° C. higher than 950° C., that is 1000° C. Metallic La was thus obtained.

The result of the analysis of metallic La is shown in Table 11. As Table 11 shows, the following was observed. Al: 8.1 wtppm, Si: 4.5 wtppm, Ca: 9.9 wtppm, Fe: 9.2 wtppm, Cu: 4.3 wtppm, Mo: <0.05 wtppm, Ta: <5 wtppm, W: 0.12 wtppm, C: 100 wtppm, N: 93 wtppm, O: 400 wtppm, S: <10 wtppm, H: 12 wtppm.

This was the result of reduction by Ca, however, the contents of Ca, as well as oxygen (O) were found to be high.

TABLE 11

4N (Low RE) La (wtppm)

| | | | |
|---|---|---|---|
| Li | <0.005 | La | |
| Be | <0.01 | Ce | 1.3 |
| B | 0.74 | Pr | <0.5 |
| F | <5 | Nd | 0.8 |
| Na | <0.05 | Sm | 0.06 |
| Mg | 0.55 | Eu | <0.05 |
| Al | 8.1 | Gd | <0.05 |
| Si | 4.5 | Tb | <0.05 |
| P | 0.07 | Dy | <0.05 |
| S | 3.6 | Ho | <0.05 |
| Cl | 0.03 | Er | <0.05 |
| K | <0.01 | Tm | <0.05 |
| Ca | 9.9 | Yb | <0.05 |
| Sc | <0.005 | Lu | <0.05 |
| Ti | 2 | Hf | <0.05 |
| V | <0.005 | Ta | <5 |
| Cr | <0.05 | W | 0.12 |
| Mn | 0.02 | Re | 0.36 |
| Fe | 9.2 | Os | <0.05 |
| Co | 0.03 | Ir | <0.05 |
| Ni | 0.13 | Pt | <0.05 |
| Cu | 4.3 | Au | <0.5 |
| Zn | <0.05 | Hg | <0.1 |
| Ga | <0.05 | Tl | <0.05 |
| Ge | <0.1 | Pb | 0.07 |
| As | <0.05 | Bi | <0.01 |
| Se | <0.05 | Th | <0.001 |
| Br | <0.05 | U | <0.001 |
| Rb | <0.01 | C | 100 |
| Sr | <0.01 | N | 93 |
| Y | 0.26 | O | 400 |
| Zr | 0.03 | S | <10 |
| Nb | 0.3 | H | 12 |
| Mo | <0.05 | | |
| Ru | <0.05 | | |
| Rh | <0.05 | | |
| Pd | <0.05 | | |
| Ag | <0.01 | | |
| Cd | <0.05 | | |
| In | <0.05 | | |
| Sn | <0.05 | | |
| Sb | <0.05 | | |
| Te | <0.05 | | |
| I | <0.05 | | |
| Cs | <0.1 | | |
| Ba | <1 | | |

(Electron Beam Melting)

Next, the lanthanum compact thus obtained was subjected to electron beam melting. This is performed by the extensive irradiation of a low output electron beam to the melting lanthanum material in a furnace. The irradiation was performed at the degree of vacuum of $6.0\times10^{-5}$ to $7.0\times10^{-4}$ mbar, and the melting output of 32 kW. The electron beam melting was repeated twice. The duration of melting was 30 minutes each. EB melt ingot was thus produced. It became possible to subject high volatile substance to volatilizing removal during the electron beam melting.

High-purity lanthanum was thus produced. The results of the analysis of the high-purity lanthanum after the electron beam melting are shown in Table 12. As Table 12 shows, the following was observed. Li: <0.005 wtppm, Na: <0.05 wtppm, Al: 7.5 wtppm, Si: 5.5 wtppm, Ca: 1.9 wtppm, Fe: 8.4 wtppm, Cu: 5.8 wtppm, Zn: <0.05 wtppm, Mo: <0.05 wtppm, Ta: <5 wtppm, W: 0.09 wtppm, C: 110 wtppm, N: 100 wtppm, O: 240 wtppm, S: <10 wtppm, and H: 10 wtppm. By using the high-purity lanthanum fluoride, the purity was further improved and the analysis values satisfied all the requirements for the present invention.

The contents of oxygen and Ca, which were refractory to lowering during the reduction by Ca, were significantly lowered. In this Example, a high-purity lanthanum fluoride having the contents of rare earth elements other than lanthanum of 10 wtppm or less, was selected as the starting material. This allowed the lanthanum after the electron beam melting to have the same contents of 10 wtppm or less.

TABLE 12

4N (Low RE) → EB (wtppm)

| | | | |
|---|---|---|---|
| Li | <0.005 | La | |
| Be | <0.01 | Ce | 1.7 |
| B | 0.34 | Pr | <0.5 |
| F | <5 | Nd | 1 |
| Na | <0.05 | Sm | <0.05 |
| Mg | 0.24 | Eu | <0.05 |
| Al | 7.5 | Gd | <0.05 |
| Si | 5.5 | Tb | <0.05 |
| P | 0.06 | Dy | <0.05 |
| S | 4.8 | Ho | <0.05 |
| Cl | 0.56 | Er | <0.05 |
| K | <0.01 | Tm | <0.05 |
| Ca | 1.9 | Yb | <0.05 |
| Sc | <0.005 | Lu | <0.05 |
| Ti | 0.81 | Hf | <0.05 |
| V | <0.005 | Ta | <5 |
| Cr | <0.05 | W | 0.09 |
| Mn | <0.01 | Re | <0.05 |
| Fe | 8.4 | Os | <0.05 |
| Co | 0.02 | Ir | <0.05 |
| Ni | 0.11 | Pt | <0.05 |
| Cu | 5.8 | Au | <0.5 |
| Zn | <0.05 | Hg | <0.1 |
| Ga | <0.05 | Tl | <0.05 |
| Ge | <0.1 | Pb | 0.04 |
| As | <0.05 | Bi | <0.01 |
| Se | <0.05 | Th | <0.001 |
| Br | <0.05 | U | <0.001 |
| Rb | <0.01 | C | 110 |
| Sr | <0.01 | N | 100 |
| Y | 0.14 | O | 240 |
| Zr | <0.01 | S | <10 |
| Nb | 0.8 | H | 10 |
| Mo | <0.05 | | |
| Ru | <0.05 | | |
| Rh | <0.05 | | |
| Pd | <0.05 | | |
| Ag | <0.01 | | |
| Cd | <0.05 | | |
| In | <0.05 | | |
| Sn | <0.05 | | |
| Sb | <0.05 | | |
| Te | <0.05 | | |
| I | <0.05 | | |
| Cs | <0.1 | | |
| Ba | <1 | | |

The lanthanum ingot thus obtained was subjected to a hot press if needed, followed by machine processing, and grinding to produce a discoid target having a dimension of φ140× 14t. The weight of the target was 1.42 kg. This was then joined with a backing plate to form a target for sputtering. The high-purity lanthanum target for sputtering having the composition described above was thus obtained. Since the target is highly prone to oxidization, it is preferable to be vacuum-packed for its storage or transportation.

Example 4

As the lanthanum starting material to be processed, lanthanum fluoride starting material having a purity of 4N was used. Metallic lanthanum is a material that is drawing a lot of attention lately, however, commercially available metallic lanthanum has a low purity and is unstable in terms of quality.

On the other hand, in regard to lanthanum fluoride, it is possible to obtain a commercialized product of high purity. However, lanthanum fluoride cannot be used as it is. Therefore, to efficiently and stably produce high-purity metallic lanthanum using the lanthanum fluoride starting material having a purity of 4N becomes essentially important.

Table 13 shows the result of the analysis on the lanthanum fluoride starting material. Major impurities contained therein include following elements. Na: 0.2 wtppm, Al: <0.05 wtppm, Si: 0.94 wtppm, Cl: 12 wtppm, Cu: <0.05 wtppm, Zn: <0.1 wtppm, C: 180 wtppm, N: 70 wtppm, O: 5200 wtppm, H: 540 wtppm. As can be seen, gas components were included at high amounts.

Contaminating rare earth elements were included only in low amounts as follows. Ce: 1.1 wtppm, Pr: <0.1 wtppm, Nd: 0.24 wtppm, Sm: 0.17 wtppm, and so on. Use of starting material with low amounts of rare earth elements enables the purity including rare earth elements (provided that lanthanum is excluded) to be 4N.

TABLE 13

Low RE LaF$_3$ (wtppm)

| | | | |
|---|---|---|---|
| Li | 0.09 | La | |
| Be | <0.01 | Ce | 1.1 |
| B | 0.94 | Pr | <0.1 |
| F | | Nd | 0.24 |
| Na | 0.2 | Sm | 0.17 |
| Mg | 0.94 | Eu | <0.5 |
| Al | <0.05 | Gd | <0.5 |
| Si | 0.94 | Tb | <0.5 |
| P | 2.1 | Dy | <0.05 |
| S | 13 | Ho | <0.05 |
| Cl | 12 | Er | <0.05 |
| K | <0.5 | Tm | <0.05 |
| Ca | <0.1 | Yb | <0.05 |
| Sc | <0.05 | Lu | <0.05 |
| Ti | 0.09 | Hf | <0.05 |
| V | 0.26 | Ta | <5 |
| Cr | 0.17 | W | <0.05 |
| Mn | <0.01 | Re | <0.1 |
| Fe | 0.14 | Os | <0.05 |
| Co | <0.01 | Ir | <0.1 |
| Ni | <0.01 | Pt | <0.5 |
| Cu | <0.05 | Au | <1 |
| Zn | <0.1 | Hg | <0.5 |
| Ga | <0.1 | Tl | <0.1 |
| Ge | <0.5 | Pb | <1 |
| As | <0.5 | Bi | <0.1 |
| Se | <5 | Th | <0.005 |
| Br | <5 | U | <0.005 |
| Rb | <5 | C | 180 |
| Sr | <0.05 | N | 70 |
| Y | <0.05 | O | 5200 |
| Zr | <0.05 | S | <10 |
| Nb | <0.05 | H | 540 |
| Mo | <0.05 | | |
| Ru | <0.1 | | |
| Rh | <0.1 | | |
| Pd | <0.5 | | |
| Ag | <0.5 | | |
| Cd | <1 | | |
| In | <0.5 | | |
| Sn | <0.5 | | |
| Sb | <0.5 | | |
| Te | <5 | | |
| I | <1 | | |
| Cs | <5 | | |
| Ba | <1 | | |

(Reduction of the Starting Material by Calcium)

The melting crucible used for the reduction was made of tantalum (Ta) and had a dimension of φ250×H 400. 14.1 kg of powdery LaF$_3$ and 6 kg of lump Ca were mixed and placed inside this tantalum crucible. Ca used as the reducing material was distilled twice and was analyzed as shown in Table 1. Ca was added at an amount about 10% in excess of the calculated amount.

The content of the tantalum crucible placed within a reduction apparatus was slowly heated to 600° C., and during which time, the inside of the reduction apparatus was evacuated to degas the content. Purified Argon gas was then injected to atmospheric pressure of 0.5.

The content was further heated. The reaction initiated when the temperature of the content reached 800° C. to 1000° C. The reaction formula is $2LaF_3+3Ca \rightarrow 2La+3CaF_2$. Since the reaction is exothermic reaction, it completed rapidly. To improve the separation of purified metal and slag, the temperature was maintained at a temperature about 50° C. higher than the melting point of metallic La. Since the melting temperature of La is 950° C., heating was adjusted so that the temperature was maintained at 50° C. higher than 950° C., that is 1000° C. Metallic La was thus obtained.

The results of the analysis of the metallic La is shown in Table 14. As Table 14 shows, the following was observed. Al: 0.82 wtppm, Si: 0.47 wtppm, Ca: 2.1 wtppm, Fe: 1.3 wtppm, Cu: <0.05 wtppm, Mo: <0.05 wtppm, Ta: <5 wtppm, W: <0.05 wtppm, C: 120 wtppm, N: 90 wtppm, O: 260 wtppm, S: <10 wtppm, H: 16 wtppm.

This was the result of reduction by Ca, however, the content of Ca, as well as oxygen (O) were found to be high.

TABLE 14

4N5 (Low RE) La (wtppm)

| | | | |
|---|---|---|---|
| Li | <0.005 | La | |
| Be | <0.01 | Ce | 1.6 |
| B | 0.74 | Pr | <0.5 |
| F | <5 | Nd | 1 |
| Na | <0.05 | Sm | <0.05 |
| Mg | 0.55 | Eu | <0.05 |
| Al | 0.82 | Gd | <0.05 |
| Si | 0.47 | Tb | <0.05 |
| P | 0.07 | Dy | <0.05 |
| S | 3.6 | Ho | <0.05 |
| Cl | 0.03 | Er | <0.05 |
| K | <0.01 | Tm | <0.05 |
| Ca | 2.1 | Yb | <0.05 |
| Sc | <0.005 | Lu | <0.05 |
| Ti | 2 | Hf | <0.05 |
| V | <0.005 | Ta | <5 |
| Cr | <0.05 | W | <0.05 |
| Mn | 0.02 | Re | <0.05 |
| Fe | 1.3 | Os | <0.05 |
| Co | 0.03 | Ir | <0.05 |
| Ni | 0.13 | Pt | <0.05 |
| Cu | <0.05 | Au | <0.5 |
| Zn | <0.05 | Hg | <0.1 |
| Ga | <0.05 | Tl | <0.05 |
| Ge | <0.1 | Pb | 0.07 |
| As | <0.05 | Bi | <0.01 |
| Se | <0.05 | Th | <0.001 |
| Br | <0.05 | U | <0.001 |
| Rb | <0.01 | C | 120 |
| Sr | <0.01 | N | 90 |
| Y | 0.24 | O | 260 |
| Zr | 0.03 | S | <10 |
| Nb | 3.1 | H | 16 |
| Mo | <0.05 | | |
| Ru | <0.05 | | |
| Rh | <0.05 | | |
| Pd | <0.05 | | |
| Ag | <0.01 | | |
| Cd | <0.05 | | |
| In | <0.05 | | |
| Sn | <0.05 | | |
| Sb | <0.05 | | |
| Te | <0.05 | | |
| I | <0.05 | | |
| Cs | <0.1 | | |
| Ba | <1 | | |

(Electron Beam Melting)

Next, the lanthanum compact thus obtained was subjected to electron beam melting. This is performed by the extensive irradiation of a low output electron beam to the melting lanthanum material in a furnace. The irradiation was performed at the degree of vacuum of $6.0 \times 10^{-5}$ to $7.0 \times 10^{-4}$ mbar, and the melting output of 32 kW. The electron beam melting was repeated twice. The duration of melting was 30 minutes each. EB melt ingot was thus produced. It became possible to subject high volatile substance to volatilizing removal during the electron beam melting.

High-purity lanthanum was thus produced. The results of the analysis of the high-purity lanthanum after the electron beam melting are shown in Table 15. As Table 15 shows, the following was observed. Li: <0.005 wtppm, Na: <0.05 wtppm, Al: 0.75 wtppm, Si: 0.36 wtppm, Ca: 0.41 wtppm, Fe: 0.71 wtppm, Cu: 0.24 wtppm, Zn: <0.05 wtppm, Mo: <0.05 wtppm, Ta: <5 wtppm, W: <0.05 wtppm, C: 110 wtppm, N: 80 wtppm, O: 150 wtppm, S: <10 wtppm, and H, 9.4 wtppm. By using high-purity lanthanum fluoride, the purity was further improved and the analysis values satisfied all the requirements for the present invention.

The contents of oxygen and Ca, which were refractory to lowering during the Ca reduction, were significantly lowered. In this Example, a high-purity lanthanum fluoride having the contents of rare earth elements other than lanthanum of 10 wtppm or less, was selected as the starting material. This allowed the lanthanum after the electron beam melting to have the same contents of 10 wtppm or less.

TABLE 15

4N5 (Low RE) → EB (wtppm)

| | | | |
|---|---|---|---|
| Li | <0.005 | La | |
| Be | <0.01 | Ce | 1.5 |
| B | 0.34 | Pr | <0.5 |
| F | <5 | Nd | 1.3 |
| Na | <0.05 | Sm | <0.05 |
| Mg | 0.24 | Eu | <0.05 |
| Al | 0.75 | Gd | <0.05 |
| Si | 0.36 | Tb | <0.05 |
| P | 0.06 | Dy | <0.05 |
| S | 4.8 | Ho | <0.05 |
| Cl | 0.56 | Er | <0.05 |
| K | <0.01 | Tm | <0.05 |
| Ca | 0.41 | Yb | <0.05 |
| Sc | <0.005 | Lu | <0.05 |
| Ti | 0.81 | Hf | <0.05 |
| V | <0.005 | Ta | <5 |
| Cr | <0.05 | W | <0.05 |
| Mn | <0.01 | Re | <0.05 |
| Fe | 0.71 | Os | <0.05 |
| Co | 0.02 | Ir | <0.05 |
| Ni | 0.11 | Pt | <0.05 |
| Cu | 0.24 | Au | <0.5 |
| Zn | <0.05 | Hg | <0.1 |
| Ga | <0.05 | Tl | <0.05 |
| Ge | <0.1 | Pb | 0.04 |
| As | <0.05 | Bi | <0.01 |
| Se | <0.05 | Th | <0.001 |
| Br | <0.05 | U | <0.001 |
| Rb | <0.01 | C | 110 |
| Sr | <0.01 | N | 80 |
| Y | 0.16 | O | 150 |
| Zr | <0.01 | S | <10 |
| Nb | 0.8 | H | 9.4 |
| Mo | <0.05 | | |
| Ru | <0.05 | | |
| Rh | <0.05 | | |
| Pd | <0.05 | | |
| Ag | <0.01 | | |
| Cd | present | | |
| In | <0.05 | | |
| Sn | <0.05 | | |
| Sb | <0.05 | | |
| Te | <0.05 | | |
| I | <0.05 | | |
| Cs | <0.1 | | |
| Ba | <1 | | |

The lanthanum ingot thus obtained was subjected to a hot press if needed, followed by machine processing, and grinding to produce a discoid target having a dimension of φ140× 14t. The weight of the target was 1.42 kg. This was then joined with a backing plate to form a target for sputtering. The high-purity lanthanum target for sputtering having the composition described above was thus obtained. Since the target is highly prone to oxidization, it is preferable to be vacuum-packed for its storage or transportation.

Comparative Example 2

Commercially Available $LaF_3$ was Reduced with Commercially Available Ca, and Subjected to EB Melting As the lanthanum starting material to be processed, lanthanum fluoride ($LaF_3$) and commercially available calcium (Ca) were used.
(Reduction by Calcium)

Next, reduction by calcium was performed using commercially available calcium. The melting crucible used for the reduction was made of tantalum (Ta). The powdery $LaF_3$ and lump Ca were mixed and placed inside this tantalum crucible. Ca, as the reducing material, is usually added at an amount about 10% in excess of the calculated amount.

The content of the tantalum crucible placed within a reduction apparatus was slowly heated to 600° C., and during which time, the inside of the reduction apparatus was evacuated to degas the content. Purified Argon gas was then injected to atmospheric pressure of 0.5.

The content was further heated. The reaction initiated when the temperature of the content reached 800° C. to 1000° C. The reaction formula is $2LaF_3+3Ca \rightarrow 2La+3CaF_2$. Since the reaction is exothermic reaction, it completed rapidly. To improve the separation of purified metal and slag, the temperature was maintained at a temperature about 50° C. higher than the melting point of metallic La for several minutes.

The yield of metallic La was about 97%. Major impurities were unreacted reducing material and slag. Furthermore, because there is a possibility of contamination by Ta, which is a crucible material, as an impurity, the reducing reaction is preferably conducted at the lowest temperature possible. The metallic La is thus obtained. The results of the analysis on the metallic La is shown in Table 16.

Major impurities contained therein include following elements. Na: 0.06 wtppm, Al: 6.2 wtppm, Si: 11 wtppm, S: 19 wtppm, Cl: 1.7 wtppm, Cu: 140 wtppm, Zn: 0.06 wtppm, C: 340 wtppm, N: 120 wtppm, O: 410 wtppm, H: 15 wtppm. As can be seen, gas components were included at high amounts.

Contaminating rare earth elements were included in relatively high amounts as follows. Ce: 80 wtppm, Pr: 33 wtppm, Nd: 16 wtppm, Sm: 6.8 wtppm, Gd: 10 wtppm, Tb: 11 wtppm, and so on.

TABLE 16

| Metallic La (wtppm) | | | |
|---|---|---|---|
| Li | <0.005 | La | |
| Be | <0.01 | Ce | 80 |
| B | 0.77 | Pr | 33 |
| F | <5 | Nd | 16 |
| Na | 0.06 | Sm | 6.8 |
| Mg | <0.05 | Eu | <0.05 |
| Al | 6.2 | Gd | 10 |
| Si | 11 | Tb | 11 |
| P | 1.2 | Dy | <0.05 |
| S | 19 | Ho | <0.05 |
| Cl | 1.7 | Er | <0.05 |
| K | <0.01 | Tm | <0.05 |
| Ca | 18 | Yb | <0.05 |
| Sc | <0.005 | Lu | <0.05 |
| Ti | 1.8 | Hf | <0.05 |
| V | 0.05 | Ta | 12 |
| Cr | 3.3 | W | 1 |
| Mn | 17 | Re | <0.05 |
| Fe | 4.8 | Os | <0.05 |
| Co | 1 | Ir | <0.05 |
| Ni | 0.5 | Pt | <0.05 |
| Cu | 140 | Au | <0.5 |
| Zn | 0.06 | Hg | <0.1 |
| Ga | <0.05 | Tl | <0.05 |
| Ge | <0.1 | Pb | 6 |
| As | 0.11 | Bi | <0.01 |
| Se | <0.05 | Th | 0.008 |
| Br | <0.05 | U | 0.008 |
| Rb | <0.01 | C | 340 |
| Sr | 1.1 | N | 120 |
| Y | 1.2 | O | 410 |
| Zr | 0.04 | S | <10 |
| Nb | <0.05 | H | 15 |
| Mo | 0.91 | | |
| Ru | <0.05 | | |
| Rh | 0.2 | | |
| Pd | <0.05 | | |
| Ag | 0.06 | | |
| Cd | <0.05 | | |
| In | <0.05 | | |
| Sn | <0.05 | | |
| Sb | <0.05 | | |
| Te | <0.05 | | |
| I | 2.8 | | |
| Cs | <0.1 | | |
| Ba | <1 | | |

Next, the material was melted in an EB melting furnace at a degree of vacuum of $7.0 \times 10^{-5}$ to $3.5 \times 10^{-5}$ mbar, and melting output of 32 kW, and an ingot was produced at a molding speed of 45 kg/h. High volatile substance was removed by volatilization during the electron beam melting.

High-purity lanthanum ingot of 22.54 kg was thus produced. The results of the analysis of the high-purity lanthanum thus obtained are shown in Table 17.

As shown in Table 17, major impurities in the lanthanum after the electron beam melting included the following. Al: 8 wtppm, Si: 16 wtppm, S: 20 wtppm, Ca: 2.9 wtppm, Ti: 2.2 wtppm, Cr: 2.1 wtppm, Mn: 1.2 wtppm, Fe: 5.1 wtppm, Cu: 165 wtppm, C: 330 wtppm, N: 110 wtppm, O: 1100 wtppm, and H: 20 wtppm.

As can be seen above, the contents of Al, Fe and Cu were not lowered, with especially high amount of residual Cu. The reduction of gas components also was not sufficient. Compared with the Examples above, the amounts of impurities were high as a whole, and the goal of the was not achieved.

TABLE 17

| La after EB (wtppm) | | | |
|---|---|---|---|
| Li | <0.005 | La | |
| Be | <0.01 | Ce | 77 |
| B | <0.01 | Pr | 30 |
| F | <5 | Nd | 22 |
| Na | <0.05 | Sm | 5.4 |
| Mg | <0.05 | Eu | <0.05 |
| Al | 8 | Gd | 8.7 |
| Si | 16 | Tb | 14 |
| P | 1.2 | Dy | <0.05 |
| S | 20 | Ho | <0.05 |

TABLE 17-continued

| La after EB (wtppm) | | | |
|---|---|---|---|
| Cl | 0.11 | Er | <0.05 |
| K | <0.01 | Tm | <0.05 |
| Ca | 2.9 | Yb | <0.05 |
| Sc | <0.005 | Lu | <0.05 |
| Ti | 2.2 | Hf | <0.05 |
| V | <0.05 | Ta | 14 |
| Cr | 2.1 | W | 3 |
| Mn | 1.2 | Re | <0.05 |
| Fe | 5.1 | Os | <0.05 |
| Co | 0.82 | Ir | <0.05 |
| Ni | 0.7 | Pt | <0.05 |
| Cu | 165 | Au | <0.5 |
| Zn | <0.05 | Hg | <0.1 |
| Ga | <0.05 | Tl | <0.05 |
| Ge | <0.1 | Pb | 0.54 |
| As | <0.05 | Bi | <0.01 |
| Se | <0.05 | Th | 0.007 |
| Br | <0.05 | U | 0.008 |
| Rb | <0.01 | C | 330 |
| Sr | <0.01 | N | 110 |
| Y | 2.2 | O | 1100 |
| Zr | 0.06 | S | <10 |
| Nb | <0.05 | H | 20 |
| Mo | 1.1 | | |
| Ru | <0.05 | | |
| Rh | 0.2 | | |
| Pd | <0.05 | | |
| Ag | <0.05 | | |
| Cd | <0.05 | | |
| In | <0.05 | | |
| Sn | <0.05 | | |
| Sb | <0.05 | | |
| Te | <0.05 | | |
| I | <0.05 | | |
| Cs | <0.1 | | |
| Ba | <1 | | |

Comparative Example 3

Low RE $LaF_3$ was Reduced with Commercially Available Ca, and Subjected to EB Melting As the lanthanum starting material to be processed, low RE lanthanum fluoride ($LaF_3$) and commercially available calcium (Ca) were used.

(Reduction with Calcium)

Next, reduction with calcium was performed using commercially available calcium. The melting crucible used for the reduction was made of tantalum (Ta). The powdery $LaF_3$ and lump Ca were mixed and placed inside this tantalum crucible. Ca, as the reducing material, is usually added at an amount about 10% in excess of the calculated amount.

The content of the tantalum crucible placed within a reduction apparatus was slowly heated to 600° C., and during which time, the inside of the reduction apparatus was evacuated to degas the content. Purified Argon gas was then injected to atmospheric pressure of 0.5.

The content was further heated. The reaction initiated when the temperature of the content reached 800° C. to 1000° C. The reaction formula is $2LaF_3 + 3Ca \rightarrow 2La + 3CaF_2$. Since the reaction is exothermic reaction, it completed rapidly. To improve the separation of purified metal and slag, the temperature was maintained at a temperature about 50° C. higher than the melting point of metallic La for several minutes.

The yield of metallic La was about 97%. Major impurities were unreacted reducing material and slag. Furthermore, because there is a possibility of contamination by Ta, which is a crucible material, as an impurity, the reducing reaction is preferably conducted at the lowest temperature possible. The metallic La was thus obtained. The results of the analysis on the metallic La is shown in Table 18.

Major impurities contained therein include following elements were included at high amounts. Al: 3.2 wtppm, Si: 2.1 wtppm, S: 11 wtppm, Ca: 4.4 wtppm, Fe: 0.44 wtppm, Mn: 14 wtppm, Cl: 1.8 wtppm, Cu: 110 wtppm, C: 320 wtppm, N: 85 wtppm, O: 450 wtppm, H: 22 wtppm. As can be seen, gas components were included at high amounts.

Contaminating rare earth elements were included in low amounts as follows. Ce: 2.4 wtppm, Pr: 0.16 wtppm, Nd: 0.64 wtppm, and others at <0.05 wtppm.

TABLE 18

| Metallic La (wtppm) | | | |
|---|---|---|---|
| Li | <0.005 | La | |
| Be | <0.01 | Ce | 2.4 |
| B | 0.33 | Pr | 0.16 |
| F | <5 | Nd | 0.64 |
| Na | <0.05 | Sm | <0.05 |
| Mg | <0.05 | Eu | <0.05 |
| Al | 3.2 | Gd | <0.05 |
| Si | 2.1 | Tb | <0.05 |
| P | 0.8 | Dy | <0.05 |
| S | 11 | Ho | <0.05 |
| Cl | 1.8 | Er | <0.05 |
| K | <0.01 | Tm | <0.05 |
| Ca | 4.4 | Yb | <0.05 |
| Sc | <0.005 | Lu | <0.05 |
| Ti | 0.9 | Hf | <0.05 |
| V | 0.34 | Ta | <5 |
| Cr | 0.37 | W | <0.05 |
| Mn | 14 | Re | <0.05 |
| Fe | 0.44 | Os | <0.05 |
| Co | <0.01 | Ir | <0.05 |
| Ni | 0.1 | Pt | <0.05 |
| Cu | 110 | Au | <0.5 |
| Zn | <0.05 | Hg | <0.1 |
| Ga | <0.05 | Tl | <0.05 |
| Ge | <0.1 | Pb | 0.6 |
| As | <0.05 | Bi | <0.01 |
| Se | <0.05 | Th | <0.005 |
| Br | <0.05 | U | <0.005 |
| Rb | <0.01 | C | 320 |
| Sr | 0.5 | N | 85 |
| Y | 2 | O | 450 |
| Zr | <0.05 | S | <10 |
| Nb | <0.05 | H | 22 |
| Mo | <0.05 | | |
| Ru | <0.05 | | |
| Rh | <0.05 | | |
| Pd | <0.05 | | |
| Ag | <0.01 | | |
| Cd | <0.05 | | |
| In | <0.05 | | |
| Sn | <0.05 | | |
| Sb | <0.05 | | |
| Te | <0.05 | | |
| I | <0.05 | | |
| Cs | <0.1 | | |
| Ba | <1 | | |

Next, the starting material was melted in an EB melting furnace at a degree of vacuum of $7.0 \times 10^{-5}$ to $3.5 \times 10^{-5}$ mbar, and melting output of 32 kW, and an ingot was produced at a molding speed of 45 kg/h. High volatile substance was removed by volatilization during the electron beam melting.

High-purity lanthanum ingot of 22.54 kg was thus produced. The results of the analysis of the high-purity lanthanum thus obtained are shown in Table 19.

As shown in Table 19, major impurities in the lanthanum after the electron beam melting included the following. Al: 4.2 wtppm, Si: 1.1 wtppm, S: 9 wtppm, Ti: 1.8 wtppm, Cr: 0.36 wtppm, Mn: 1.7 wtppm, Fe: 0.65 wtppm, Cu: 98 wtppm, C: 420 wtppm, N: 140 wtppm, O: 900 wtppm, and H: 13 wtppm.

As can be seen above, although the purity improved slightly over Comparative Example 2, the contents of Al, S, Mn and Cu were not lowered, with especially high amount of residual Cu. The reduction of gas components also was not sufficient. Compared with the Examples above, the amounts of impurities were high as a whole, and the goal of the present invention was not achieved.

TABLE 19

| La after EB (wtppm) | | | |
|---|---|---|---|
| Li | <0.005 | La | |
| Be | <0.01 | Ce | 3.1 |
| B | 0.68 | Pr | 0.08 |
| F | <5 | Nd | 0.55 |
| Na | <0.05 | Sm | <0.05 |
| Mg | <0.05 | Eu | <0.05 |
| Al | 4.2 | Gd | <0.05 |
| Si | 1.1 | Tb | <0.05 |
| P | 0.65 | Dy | <0.05 |
| S | 9 | Ho | <0.05 |
| Cl | 0.14 | Er | <0.05 |
| K | <0.01 | Tm | <0.05 |
| Ca | <1.4 | Yb | <0.05 |
| Sc | <0.005 | Lu | <0.05 |
| Ti | 1.8 | Hf | <0.05 |
| V | 0.77 | Ta | <5 |
| Cr | 0.36 | W | <0.05 |
| Mn | 1.7 | Re | <0.05 |
| Fe | 0.65 | Os | <0.05 |
| Co | <0.01 | Ir | <0.05 |
| Ni | 0.2 | Pt | <0.05 |
| Cu | 98 | Au | <0.5 |
| Zn | <0.05 | Hg | <0.1 |
| Ga | <0.05 | Tl | <0.05 |
| Ge | <0.1 | Pb | 0.6 |
| As | <0.05 | Bi | <0.01 |
| Se | <0.05 | Th | <0.005 |
| Br | <0.05 | U | <0.005 |
| Rb | <0.01 | C | 420 |
| Sr | <0.01 | N | 140 |
| Y | 1.5 | O | 900 |
| Zr | <0.05 | S | <10 |
| Nb | <0.05 | H | 13 |
| Mo | <0.05 | | |
| Ru | <0.05 | | |
| Rh | <0.05 | | |
| Pd | <0.05 | | |
| Ag | <0.01 | | |
| Cd | <0.05 | | |
| In | <0.05 | | |
| Sn | <0.05 | | |
| Sb | <0.05 | | |
| Te | <0.05 | | |
| I | <0.05 | | |
| Cs | <0.1 | | |
| Ba | <1 | | |

It is clear from comparing the Examples and Comparative Examples above that the selection of starting material, especially the selection of lanthanum fluoride starting material having a purity of 4N or more (provided that rare earth elements other than lanthanum, and gas components are excluded), and the processes of reducing the starting material with distilled calcium to produce lanthanum having a purity of 4N or more, and removing the volatile substance by subjecting the obtained lanthanum to electron beam melting, are important. Thereby, it becomes possible to produce a high-purity lanthanum having a purity of 4N or more excluding rare earth elements other than lanthanum, and gas components.

The high-purity lanthanum, the sputtering target produced from the high-purity lanthanum, and the thin film for metal gate having the high-purity lanthanum as the main component, obtained by the present invention, are useful. Since the films formed thereby do not hinder or interfere, as an electronic material deployed in the vicinity of silicon substrate, with the functions of electronic equipments; the present invention is particularly useful as the materials for gate insulator or metal gate film.

The invention claimed is:

1. A method for producing high-purity lanthanum, comprising the steps of reducing, with distilled calcium, a lanthanum fluoride starting material that has a purity of 4N or more excluding rare earth elements other than lanthanum and gas components, and removing volatile substances by subjecting the obtained lanthanum to electron beam melting so that the purity excluding rare earth elements other than lanthanum and gas components is 4N5 or more, the content of Al and Fe is respectively 5 wtppm or less, the content of Cu is 1 wtppm or less, and the total content of gas components is 1000 wtppm or less.

2. The method for producing high-purity lanthanum according to claim 1, wherein the high-purity lanthanum contains C in the amount of 200 wtppm or less.

3. The method for producing high-purity lanthanum according to claim 2, wherein the high-purity lanthanum contains rare earth elements other than lanthanum in the amount of 10 wtppm or less.

4. The method according to claim 1, wherein the high-purity lanthanum contains rare earth elements other than lanthanum in a total amount of 10 wtppm or less.

* * * * *